(12) United States Patent
Li et al.

(10) Patent No.: US 11,646,279 B2
(45) Date of Patent: May 9, 2023

(54) CONTACT PAD STRUCTURES AND METHODS FOR FABRICATING CONTACT PAD STRUCTURES

(71) Applicant: GLOBALFOUNDRIES Singapore Pte. Ltd., Singapore (SG)

(72) Inventors: Xiaodong Li, Singapore (SG); Ramasamy Chockalingam, Singapore (SG); Juan Boon Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 101 days.

(21) Appl. No.: 17/184,659

(22) Filed: Feb. 25, 2021

(65) Prior Publication Data

US 2022/0270991 A1    Aug. 25, 2022

(51) Int. Cl.
*H01L 23/48* (2006.01)
*H01L 23/00* (2006.01)

(52) U.S. Cl.
CPC .............. *H01L 24/05* (2013.01); *H01L 24/03* (2013.01); *H01L 2224/0221* (2013.01); *H01L 2224/0236* (2013.01); *H01L 2224/02375* (2013.01); *H01L 2224/02381* (2013.01); *H01L 2224/04042* (2013.01); *H01L 2224/05647* (2013.01)

(58) Field of Classification Search
CPC ...... H01L 24/03–10; H01L 2224/0221–05647
See application file for complete search history.

(56) References Cited

U.S. PATENT DOCUMENTS

| | | | |
|---|---|---|---|
| 7,328,417 B2 | 2/2008 | Ali et al. | |
| 7,383,521 B2 | 6/2008 | Smith et al. | |
| 7,592,710 B2* | 9/2009 | Hsia | ............ H01L 24/05 257/781 |
| 7,774,726 B2 | 8/2010 | White | |
| 8,552,560 B2 | 10/2013 | Bhatt et al. | |
| 2011/0175215 A1* | 7/2011 | Farooq | ............ H01L 29/0657 257/E23.141 |
| 2021/0035907 A1* | 2/2021 | Chen | ............ H01L 21/76877 |

* cited by examiner

*Primary Examiner* — Hoa B Trinh
(74) *Attorney, Agent, or Firm* — Viering Jentschura & Partner MBB

(57) ABSTRACT

A semiconductor structure may be provided, including a conductive pad, a slot arranged through the conductive pad, a passivation layer arranged over the conductive pad and a plurality of electrical interconnects arranged under the conductive pad. The conductive pad may include an electrically conductive material and the slot may include an electrically insulating material. The passivation layer may include an opening that may expose a portion of the conductive pad and the slot may be arranged laterally between the exposed portion of the conductive pad and the plurality of electrical interconnects.

20 Claims, 15 Drawing Sheets

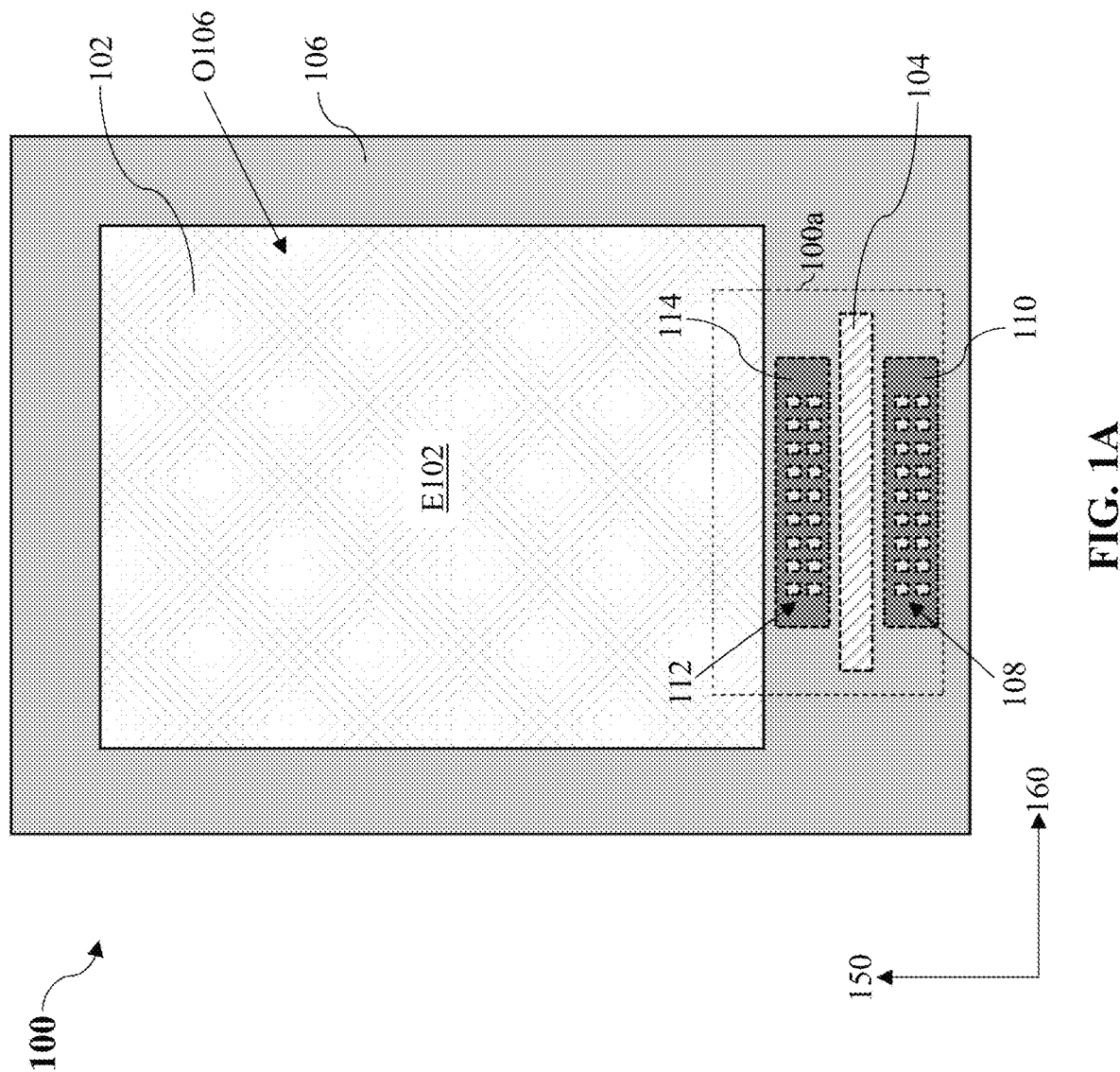

CONTACT PAD STRUCTURES AND
METHODS FOR FABRICATING CONTACT
PAD STRUCTURES

TECHNICAL FIELD

The present disclosure relates generally to contact pad structures and methods for fabricating the contact pad structures.

BACKGROUND

A bond pad structure is often used for connecting a circuit on a semiconductor die to a pin on a packaged chip. A bond pad structure usually includes a copper pad having surfaces lined with a bimetallic tantalum nitride/tantalum (TaN/Ta) liner, and a plurality of vias arranged under the copper pad. The bond pad structure may be formed in the far back-end-of-line (BEOL) wiring level of the semiconductor die, and hence, may be electrically connected with the circuit on the semiconductor die. In a typical wire bonding process, a connector wire (e.g. copper/gold wire) is bonded at one end to the copper pad of the bond pad structure (and hence, to the circuit on the semiconductor die), and at the other end to the pin on the packaged chip.

The fabrication of a semiconductor device usually involves multiple wire bonding processes, and a molding process thereafter to encapsulate the semiconductor dies and the connector wires. During the molding process, a molding compound is deposited over the semiconductor dies and contacts the copper pads of the bond pad structures. The molding compound often includes contaminates such as halides (for example, fluorine, chlorine, bromine, iodine) or halide compounds (for example, calcium chloride). Due to the heat and humidity applied during the molding process, these contaminates may diffuse through the copper pads of the bond pad structures to reach the vias thereunder, hence, contaminating the vias. Such diffusion can also cause corrosion of the interfaces between the surfaces of the copper pad and the TaN/Ta liner, forming gaps at these interfaces. The contaminates within the molding compound can flow through these gaps to the vias, further contaminating the vias. These can cause delamination between the vias and the copper pads of the bond pad structures. As a result, the electrical connection between the vias and the copper pads may be affected. In turn, the electrical connection between the bond pad structures and the respective circuits on the semiconductor dies may be affected.

SUMMARY

According to various non-limiting embodiments, there may be provided a semiconductor structure including: a conductive pad including an electrically conductive material; a slot arranged through the conductive pad and including an electrically insulating material; a passivation layer arranged over the conductive pad and including an opening that may expose a portion of the conductive pad; and a plurality of electrical interconnects arranged under the conductive pad. The slot may be arranged laterally between the exposed portion of the conductive pad and the plurality of electrical interconnects.

According to various non-limiting embodiments, there may be provided a method for fabricating a semiconductor structure, including: forming a conductive pad including an electrically conductive material; forming a slot including an electrically insulating material through the conductive pad; forming a passivation layer over the conductive pad, where the passivation layer may include an opening that may expose a portion of the conductive pad; and forming a plurality of electrical interconnects under the conductive pad. The slot may be arranged laterally between the exposed portion of the conductive pad and the plurality of electrical interconnects.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Non-limiting embodiments of the invention will now be illustrated for the sake of example only with reference to the following drawings, in which:

FIG. 1A shows a simplified top view of a semiconductor structure according to various non-limiting embodiments.

DETAILED DESCRIPTION

Figure 1B:
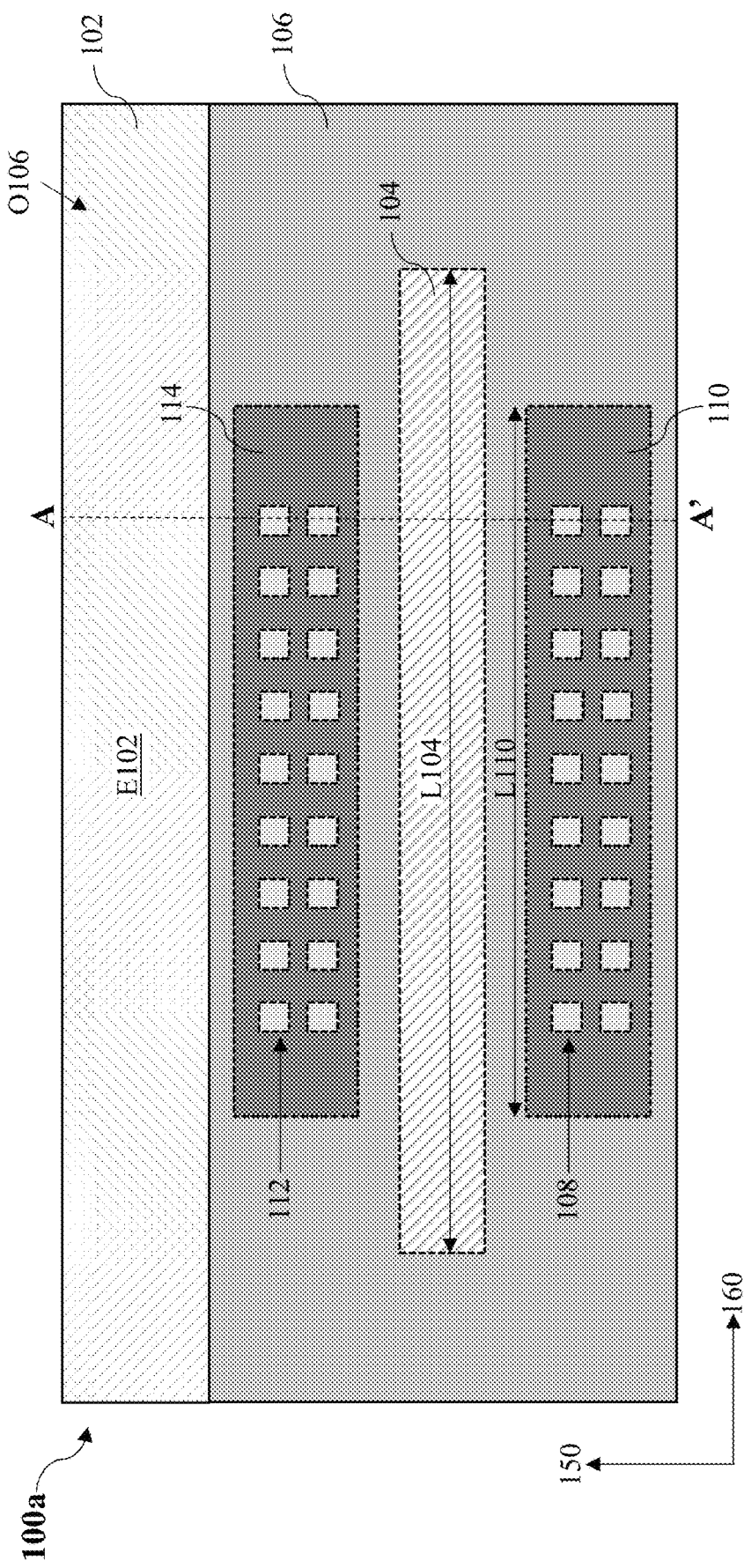
FIG. 1B shows a magnified view of a portion of the semiconductor structure of FIG. 1A

The embodiments generally relate to semiconductor structures. More particularly, some embodiments relate to bond pad structures. The bond pad structures may be used for connecting a circuit on a semiconductor die to a pin on a packaged chip.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction/axis is modified by a term or terms, such as "substantially" to mean that the direction/axis is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 1C:
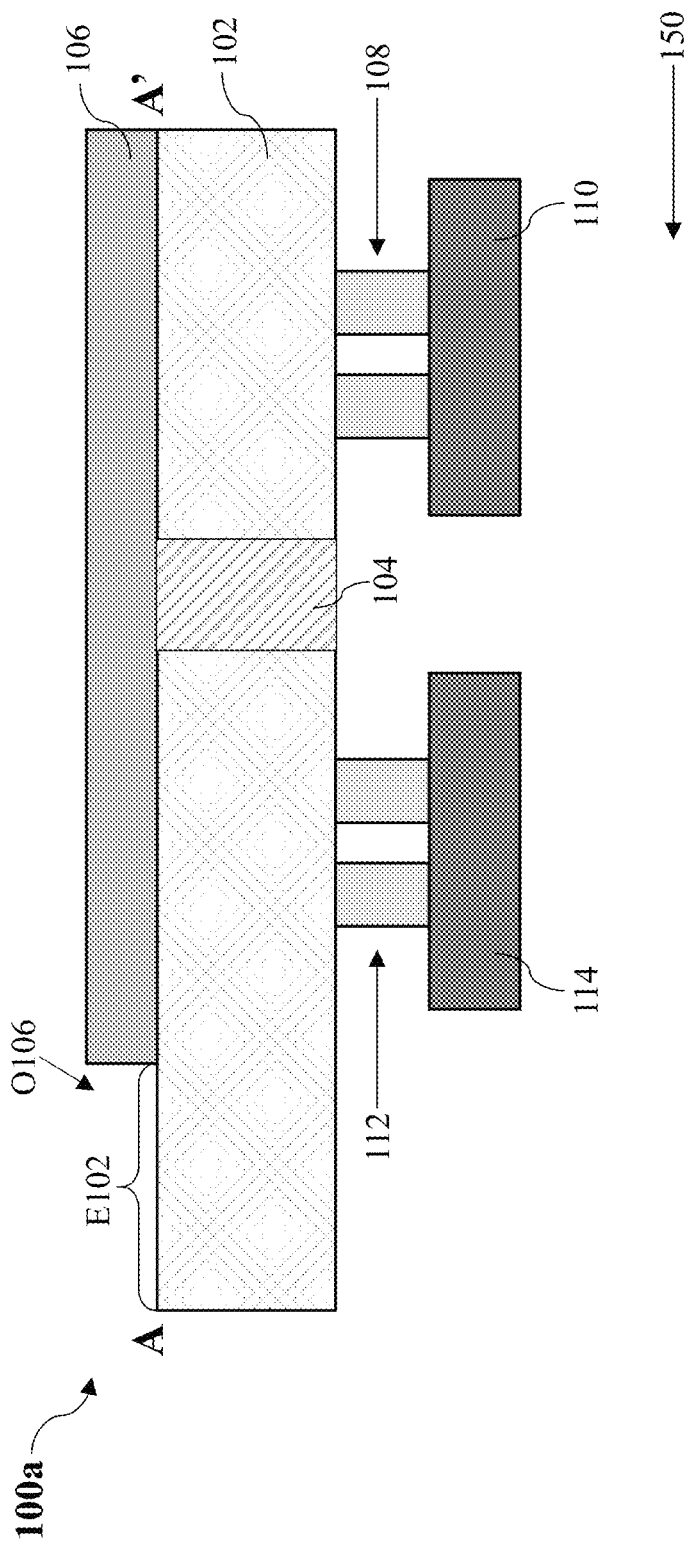
FIG. 1C shows a simplified cross-sectional view of the portion of FIG. 1B.

FIG. 1A shows a simplified top view of a semiconductor structure 100 according to various non-limiting embodiments. FIG. 1B shows a magnified view of a portion 100a of the semiconductor structure 100. FIG. 1C shows a simplified cross-sectional view of the portion 100a along the line A-A' in FIG. 1B. The semiconductor structure 100 may be a bond pad structure (or in other words, a contact pad structure).

Referring to FIGS. 1A-1C, the semiconductor structure 100 may include a conductive pad 102. The conductive pad 102 may include an electrically conductive material such as, but not limited to, copper. The conductive pad 102 may alternatively be referred to as a bond pad.

The semiconductor structure 100 may further include a slot 104 arranged through the conductive pad 102. For example, as shown in FIGS. 1A-1C, the slot 104 may be arranged fully through a thickness of the conductive pad 102. The slot 104 may be an elongate slot and may include an electrically insulating material, such as, but not limited to a dielectric material, for example, an oxide, a silicon nitride, a silicon oxy-nitride, a silicon carbon nitride, or combinations thereof. In various non-limiting embodiments, the entire slot 104 may include an electrically insulating material.

The semiconductor structure 100 may further include a passivation layer 106 arranged over the conductive pad 102. As more clearly shown in FIG. 1A, the passivation layer 106 may include an opening O106 that may expose a portion E102 of the conductive pad 102. Further, as more clearly shown in FIG. 1C, the passivation layer 106 may be arranged over the slot 104, or in other words, the slot 104 may be arranged through the unexposed portion of the conductive pad 102. The passivation layer 106 may include a passivation material such as, but not limited to, an oxide, a nitride, or combinations thereof.

The semiconductor structure 100 may also include a first plurality of electrical interconnects 108. As shown in FIG. 1C, the first plurality of electrical interconnects 108 may be arranged under the conductive pad 102 and may adjoin the conductive pad 102. Each of the first plurality of electrical interconnects 108 may include an electrically conductive material, such as, but not limited to a metal. For example, the first plurality of electrical interconnects 108 may be metal vias. As shown in FIGS. 1A and 1B, the first plurality of electrical interconnects 108 may include an array of electrical interconnects 108, where each column of electrical interconnects 108 may extend along a first direction 150 and each row of electrical interconnects 108 may extend along a second direction 160 substantially perpendicular to the first direction 150. It is understood that the number of rows and columns of electrical interconnects 108 may differ from that shown in FIGS. 1A and 1B. Further, the electrical interconnects 108 may be arranged in any other manner.

The semiconductor structure 100 may further include a first electrically conductive element 110 arranged under the first plurality of electrical interconnects 108. As more clearly shown in FIG. 1C, the passivation layer 106 may be arranged over the first plurality of electrical interconnects 108 and the first electrically conductive element 110. The first electrically conductive element 110 may include an electrically conductive material such as, but not limited to, a metal. The first electrically conductive element 110 may contact a circuit on a semiconductor die on which the semiconductor structure 100 is formed. In some non-limiting embodiments, the first electrically conductive element 110 may be omitted and the first plurality of electrical interconnects 108 may contact the circuit on the semiconductor die.

The slot 104 may be arranged laterally between the exposed portion E102 of the conductive pad 102 and the first plurality of electrical interconnects 108. For example, as shown in FIGS. 1A-1C, the slot 104 may be arranged laterally between the exposed portion E102 of the conductive pad 102 and the first plurality of electrical interconnects 108 along the first direction 150. As more clearly shown in FIG. 1B, the elongate slot 104 may extend longitudinally along the second direction 160 (in other words, a length L104 of the elongate slot 104 may extend along the second direction 160). Further, the length L104 of the elongate slot 104 may be greater than a length L110 of the first electrically conductive element 110. Accordingly, the slot 104 may overlap laterally (along the first direction 150) with all the electrical interconnects 108 including the first column and the last column of the electrical interconnects 108.

The semiconductor structure 100 may further include a second plurality of electrical interconnects 112. As shown in FIG. 1C, the second plurality of electrical interconnects 112 may be arranged under the conductive pad 102 and may adjoin the conductive pad 102. Each of the second plurality of electrical interconnects 112 may include an electrically conductive material, such as, but not limited to a metal. The second plurality of electrical interconnects 112 may be arranged laterally between the exposed portion E102 of the conductive pad 102 and the slot 104. For example, as shown in FIGS. 1A-1C, the second plurality of electrical interconnects 112 may be arranged laterally between the exposed portion E102 of the conductive pad 102 and the slot 104 along the first direction 150. Similar to the first plurality of electrical interconnects 108, the second plurality of electrical interconnects 112 may include an array of electrical interconnects 112, where each column of electrical interconnects 112 may extend along the first direction 150 and each row of electrical interconnects 112 may extend along the second direction 160. Similarly, it is understood that the number of rows and columns of electrical interconnects 112 may differ from that shown in FIGS. 1A and 1B and the second plurality of electrical interconnects 112 may be arranged in any other manner.

As shown in FIGS. 1A-1C, the semiconductor structure 100 may further include a second electrically conductive element 114 arranged under the second plurality of electrical interconnects 112. As more clearly shown in FIG. 1C, the passivation layer 106 may be arranged over the second plurality of electrical interconnects 112 and the second electrically conductive element 114. However, in some alternative non-limiting embodiments, the second plurality of electrical interconnects 112 and the second electrically conductive element 114 may instead be arranged under the exposed portion E102 of the conductive pad 102. The second electrically conductive element 114 may include an electrically conductive material such as, but not limited to, metal.

The semiconductor structure 100 may be formed in the far BEOL wiring level of a semiconductor die and may be used for electrically connecting a connector wire to a circuit on the semiconductor die. For example, the first electrically conductive element 110 of the semiconductor structure 100 may contact the circuit on the semiconductor die, and accordingly, the first plurality of electrical interconnects 108 adjoining the conductive pad 102 may be electrically connected to the circuit on the semiconductor die. During the wire bonding process, one end of the connector wire may be bonded to the exposed portion E102 of the conductive pad 102 and hence, may be electrically connected to the circuit on the semiconductor die. The other end of the connector wire may be bonded to a pin on a packaged chip, and hence, the circuit on the semiconductor die may be electrically connected with the pin on the packaged chip.

Figure 2:
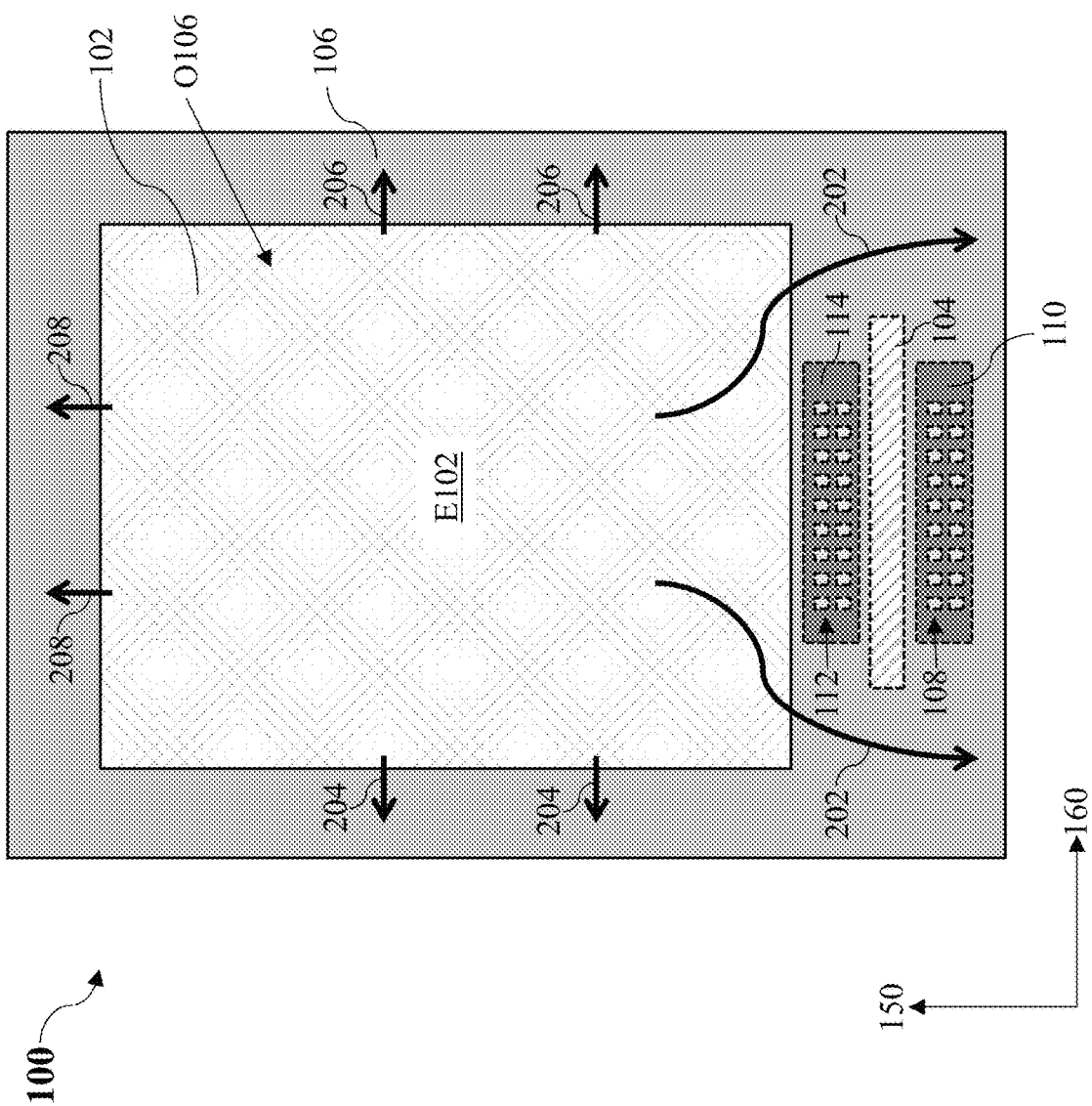
FIG. 2 shows a simplified top view of the semiconductor structure of FIGS. 1A-1C during a molding process.

FIG. 2 shows a simplified top view of the semiconductor structure 100 during a molding process. For clarity of illustration, some reference numerals are omitted from FIG. 2.

During the molding process, a molding compound (not shown in FIG. 2) may contact the exposed portion E102 of the conductive pad 102. FIG. 2 shows a plurality of arrows 202, 204, 206, 208 indicating diffusion of contaminates (for example, halides such as, but not limited to, fluorine, chlorine, bromine, iodine or halide compounds such as, but not limited to, calcium chloride) from the molding compound through the conductive pad 102. As indicated by the arrows 202, 204, 206, 208, the contaminates from the molding compound may flow from an interface between the exposed portion E102 of the conductive pad 102 and the molding compound towards the rest of the conductive pad 102. Referring to the arrows 202 in FIG. 2, due to the presence of the slot 104, the contaminates from the molding compound may be diverted away from the first plurality of electrical interconnects 108. This may hence reduce the amount of contaminates reaching the electrical interconnects 108. In turn, this may reduce the contamination of the electrical interconnects 108 and reduce the corrosion of (and hence, the delamination along) the interfaces between the interconnects 108 and the conductive pad 102.

When the semiconductor structure 100 is in use, the second plurality of electrical interconnects 112 and the second electrically conductive element 114 may not be electrically connected to (in other words, may be electrically isolated from) the semiconductor die. The second plurality of electrical interconnects 112 may be referred to as dummy interconnects and the second electrically conductive element 114 may be referred to as a dummy metal or a landing metal, where these dummy interconnects and dummy/landing metal may function as sacrificial corrosive structures. Contaminates from the molding compound may be absorbed by these dummy interconnects and dummy/landing metal along the path towards the first plurality of electrical interconnects 108. Thus, a smaller amount of contaminates from the molding compound may reach the electrical interconnects 108, further reducing the contamination of these electrical interconnects 108.

Therefore, the electrical connection between the electrical interconnects 108 and the conductive pad 102 of the semiconductor structure 100 may improve. In turn, the unbiased highly accelerated stress test (UHAST) reliability performance of the semiconductor structure 100 may improve.

Figure 3:
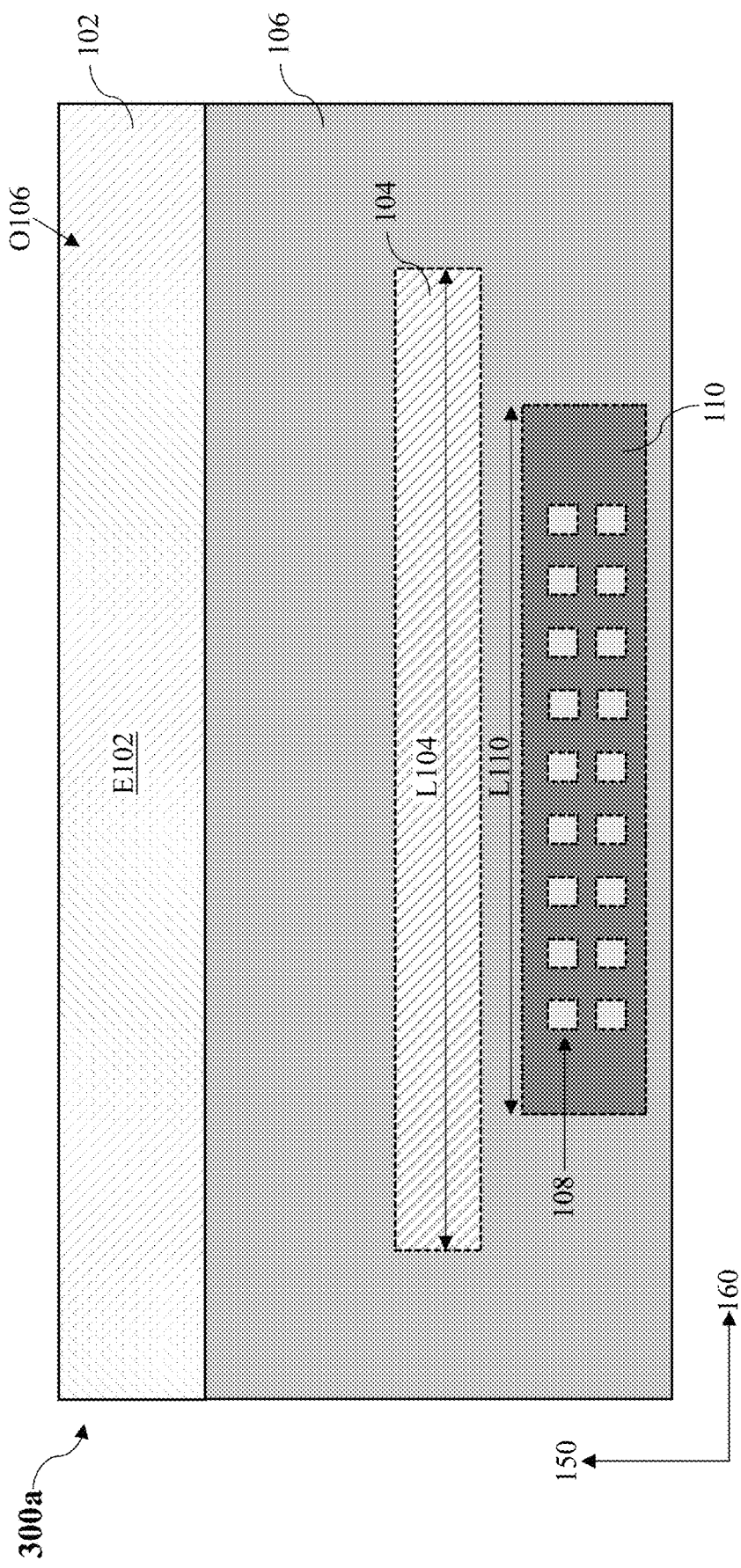
FIG. 3 shows a simplified top view of a portion of a first alternative semiconductor structure according to various non-limiting embodiments.

FIG. 3 shows a simplified top view of a portion 300a of a first alternative semiconductor structure according to various non-limiting embodiments. The first alternative semiconductor structure may be similar to the semiconductor structure 100, except that the portion 100a may instead be the portion 300a. The portion 300a is similar to the portion 100a shown in FIG. 1B and hence, the common features are labelled with the same reference numerals and need not be discussed.

As shown in FIG. 3, in contrast to the portion 100a, the second plurality of electrical interconnects 112 and the second electrically conductive element 114 may be absent from the portion 300a. In other words, only the first plurality of electrical interconnects 108 may be present such that the slot 104 may be arranged between the exposed portion E102 of the conductive pad 102 and the first plurality of electrical interconnects 108. The fabrication of the semiconductor structure with the portion 300a may thus be simpler.

Figure 4:
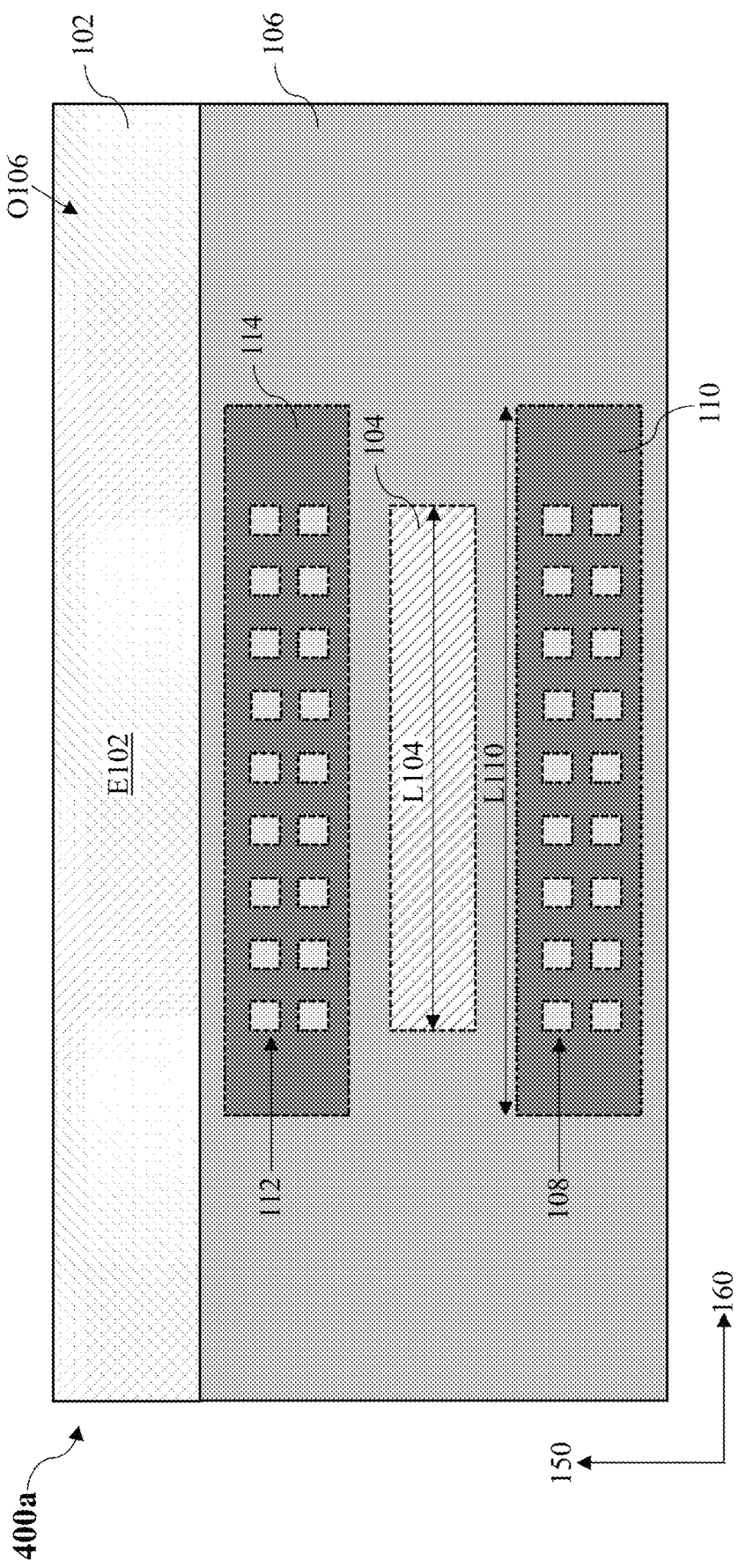
FIG. 4 shows a simplified top view of a portion of a second alternative semiconductor structure according to various non-limiting embodiments.

FIG. 4 shows a simplified top view of a portion 400a of a second alternative semiconductor structure according to various non-limiting embodiments. The second alternative semiconductor structure may be similar to the semiconductor structure 100, except that the portion 100a may instead be the portion 400a. The portion 400a is similar to the portion 100a shown in FIG. 1B and hence, the common features are labelled with the same reference numerals and need not be discussed.

As shown in FIG. 4, in the portion 400a, the length L104 of the slot 104 may be less than the length L110 of the first electrically conductive element 110. However, the slot 104 in the portion 400a may still overlap with all of the electrical interconnects 108 including the first and last columns of the array of electrical interconnects 108. Accordingly, the slot 104 may still help to divert the contaminates from the molding compound away from the electrical interconnects 108.

Figure 5A:
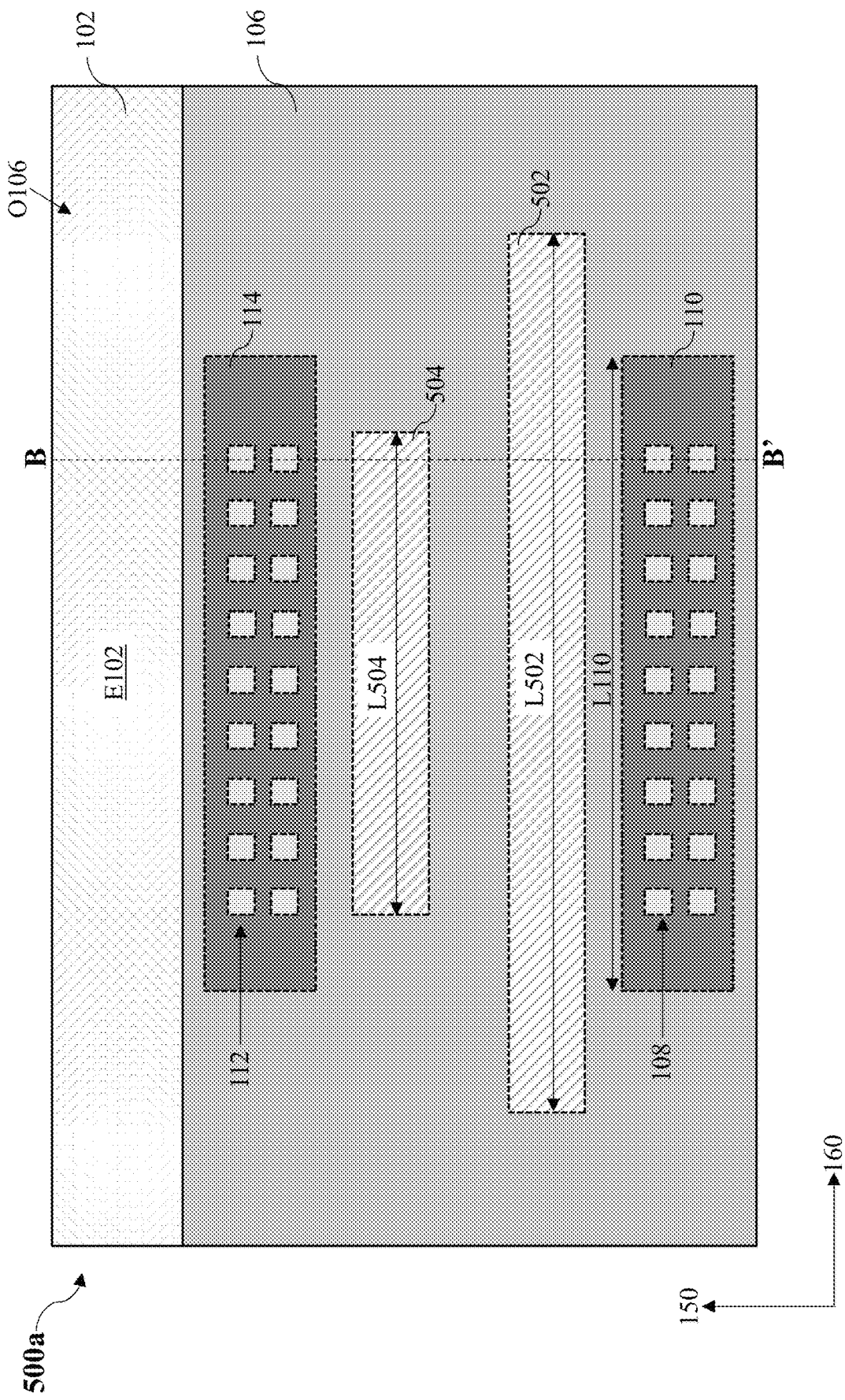
FIG. 5A shows a simplified top view of a portion of a third alternative semiconductor structure according to various non-limiting embodiments.
Figure 5B:
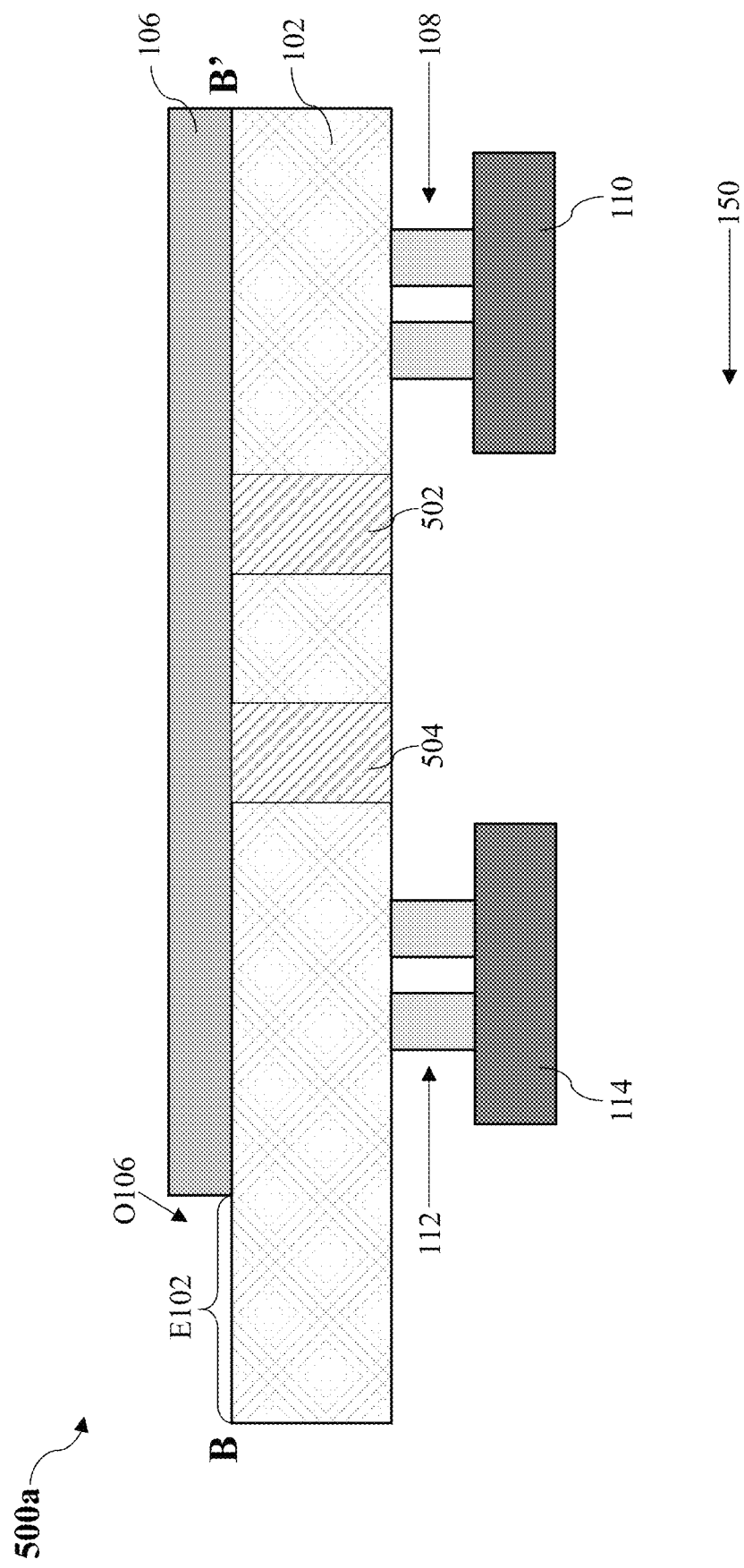
FIG. 5B shows a simplified cross-sectional view of the portion of FIG. 5A.

FIG. 5A shows a simplified top view of a portion 500a of a third alternative semiconductor structure according to various non-limiting embodiments. The third alternative semiconductor structure may be similar to the semiconductor structure 100, except that the portion 100a may instead be the portion 500a. FIG. 5B shows a simplified cross-sectional view of the portion 500a along the line B-B' of FIG. 5A. The portion 500a is similar to the portion 100a shown in FIG. 1B and hence, the common features are labelled with the same reference numerals and need not be discussed.

As shown in FIGS. 5A and 5B, the portion 500a may also include a conductive pad 102. However, unlike the portion 100a, the portion 500a may include two slots (a first slot 502 and a second slot 504) arranged fully through a thickness of the conductive pad 102. Each of the first and second slots 502, 504 may be an elongate slot and may include an electrically insulating material, such as, but not limited to an oxide, a silicon nitride, a silicon oxy-nitride, a silicon carbon nitride, or combinations thereof. In various non-limiting embodiments, each of the first and second slots 502, 504 may be entirely filled with an electrically insulating material. Each slot 502, 504 may extend longitudinally along the second direction 160. Referring to FIG. 5B, the passivation layer 106 may be arranged over both the first slot 502 and the second slot 504.

The portion 500a may also include a first plurality of electrical interconnects 108 and a second plurality of electrical interconnects 112 arranged under the conductive pad 102. The first and second slots 502, 504 may be arranged laterally between the exposed portion E102 of the conductive pad 102 and the first plurality of electrical interconnects 108 along the first direction 150. As shown in FIG. 5A, the first slot 502 may be arranged laterally between the second slot 504 and the first plurality of electrical interconnects 108 along the first direction 150; the second slot 504 may be arranged laterally between the second plurality of electrical interconnects 112 and the first slot 502 along the first direction 150; and the second plurality of electrical interconnects 112 may be arranged laterally between the exposed portion E102 of the conductive pad 102 and the second slot 504 along the first direction 150. However, in some alternative non-limiting embodiments, the second plurality of electrical interconnects 112 may instead be arranged under the exposed portion E102 of the conductive pad 102. A length L502 of the first slot 502 may be greater than a length L110 of the first electrically conductive element 110; whereas, a length L504 of the second slot 504 may be less than the length L110 (in other words, may be less than the length L502 of the first slot 502). Alternatively, the length L504 of the second slot 504 may be greater than the length L110 of the first electrically conductive element 110. In these alternative non-limiting embodiments, the length L504 may or may not be greater than the length L502 of the first slot 502.

Figure 6A:
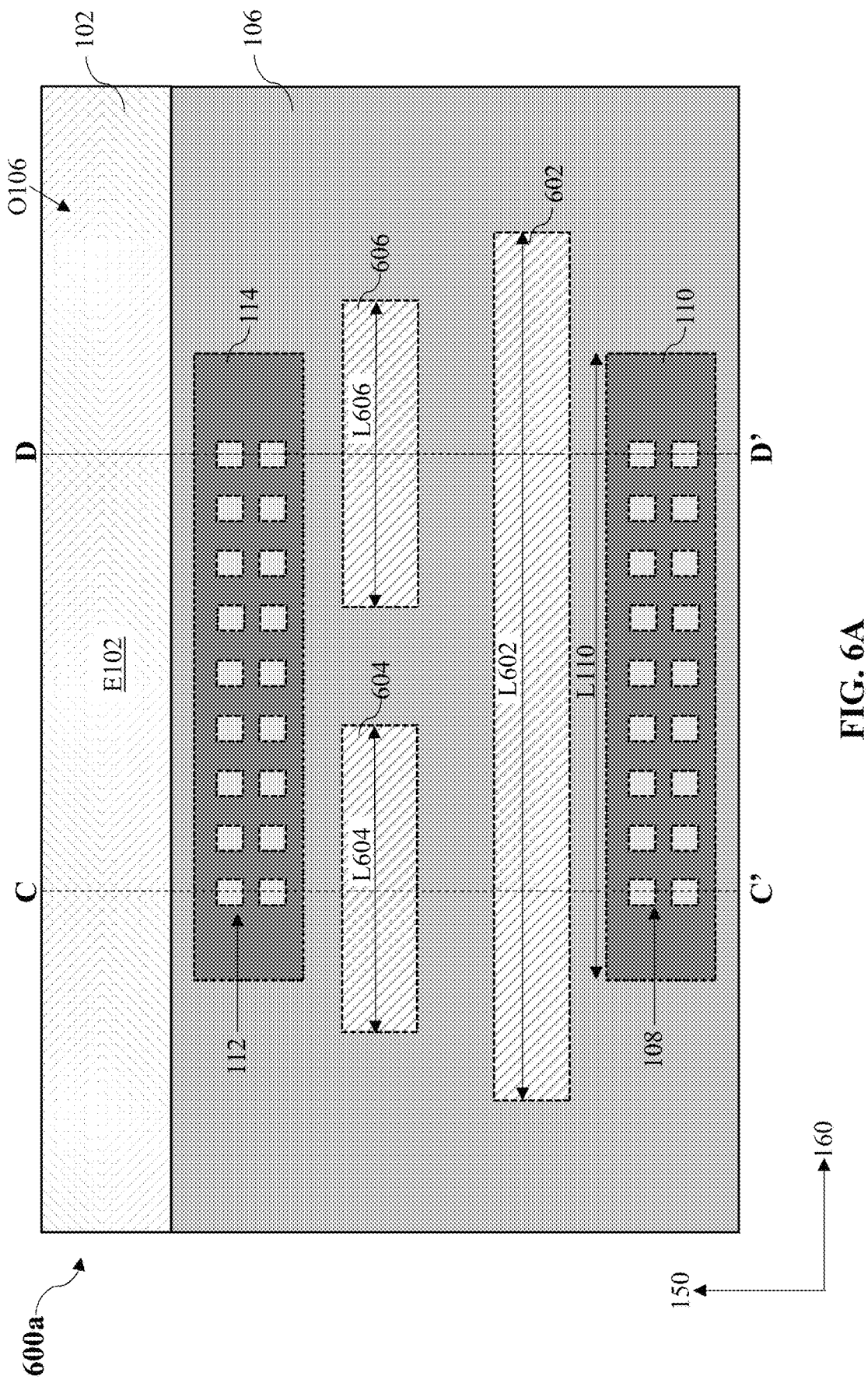
FIG. 6A shows a simplified top view of a portion of a fourth alternative semiconductor structure according to various non-limiting embodiments.
Figure 6B:
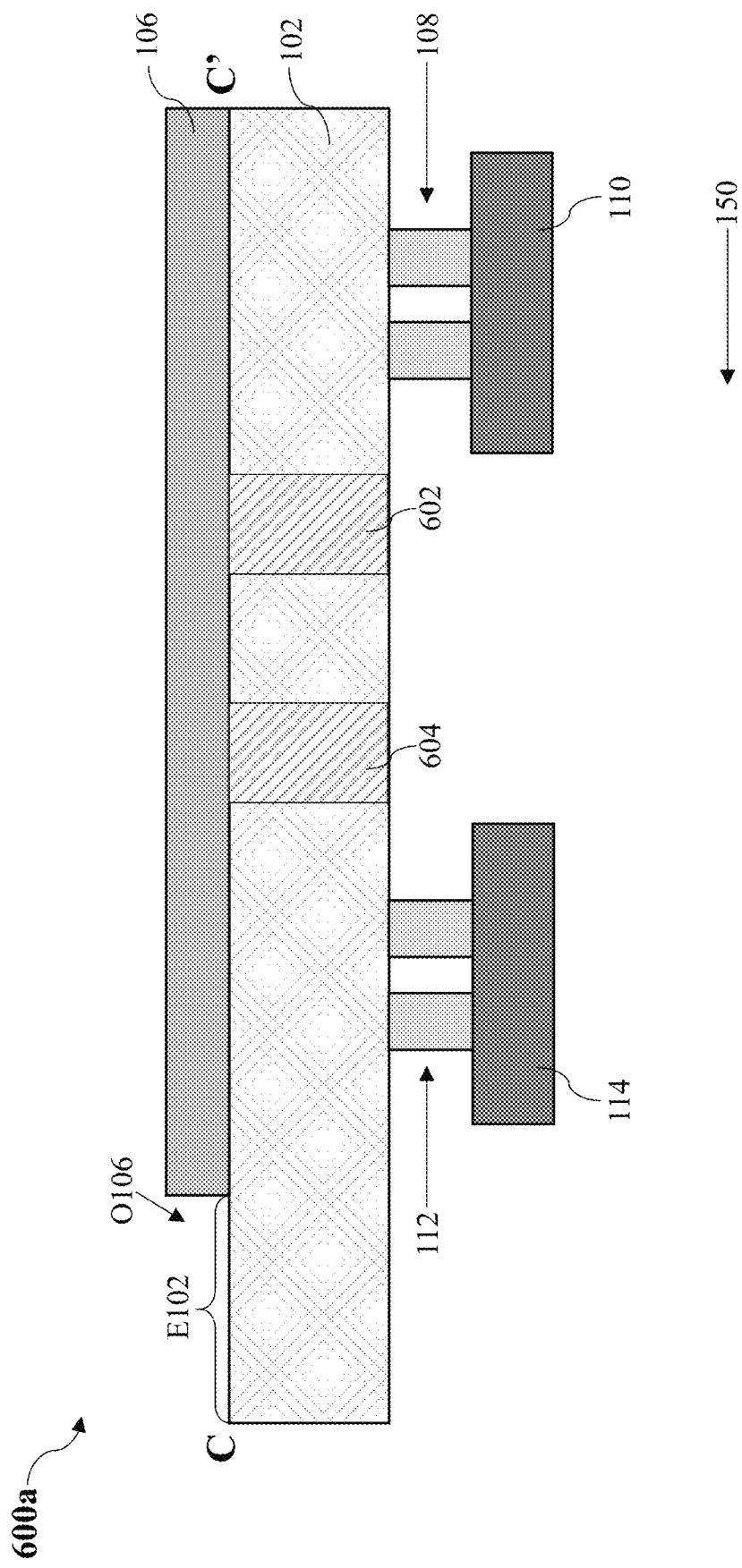
FIG. 6B shows a first simplified cross-sectional view of the portion of FIG. 6A.
Figure 6C:
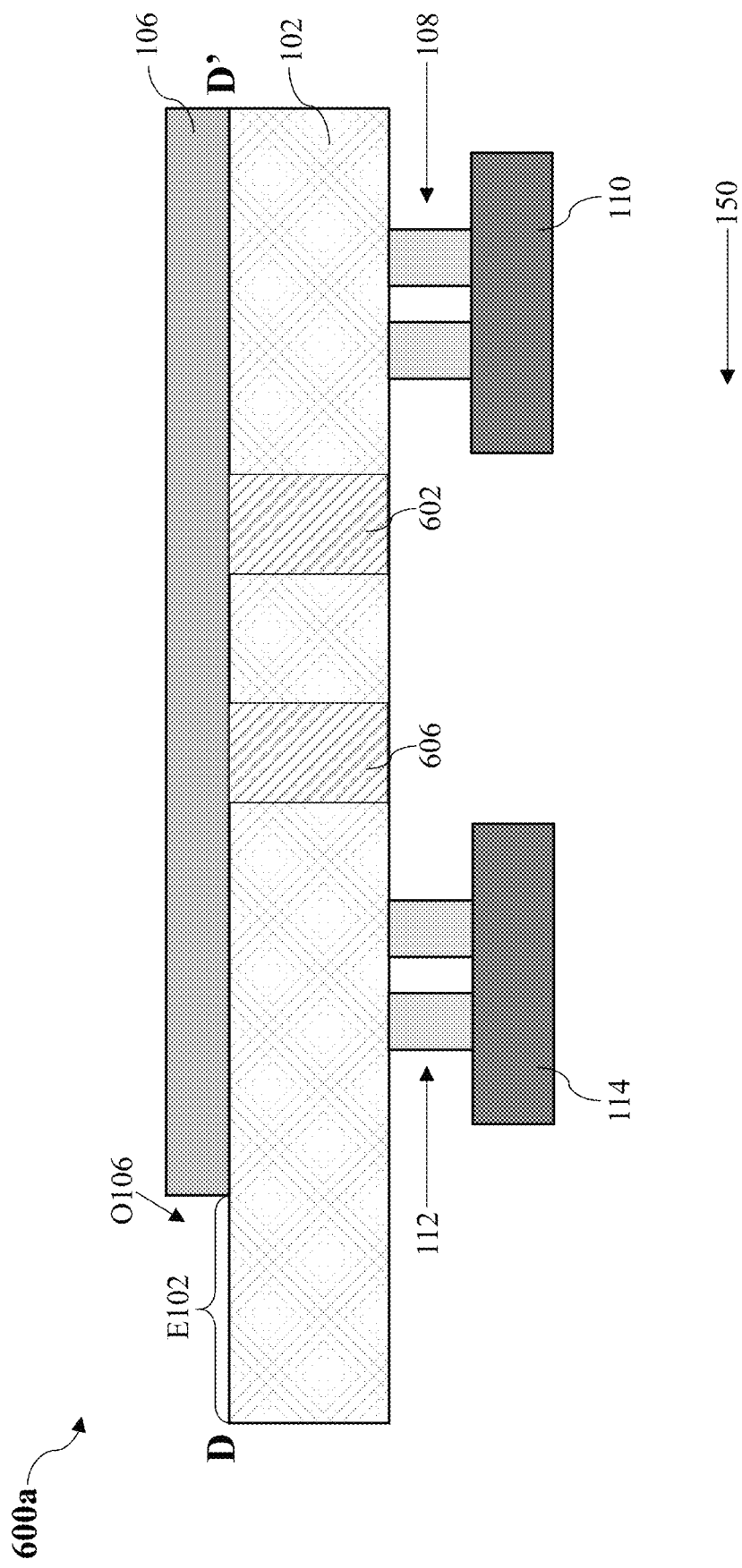
FIG. 6C shows a second simplified cross-sectional view of the portion of FIG. 6A.

FIG. 6A shows a simplified top view of a portion 600a of a fourth alternative semiconductor structure according to various non-limiting embodiments. The fourth alternative semiconductor structure may be similar to the semiconductor structure 100, except that the portion 100a may instead be the portion 600a. FIG. 6B shows a first simplified cross-sectional view of the portion 600a along the line C-C' of FIG. 6A, and FIG. 6C shows a second simplified cross-sectional view of the portion 600a along the line D-D' of FIG. 6A. The portion 600a is similar to the portion 100a shown in FIG. 1B and hence, the common features are labelled with the same reference numerals and need not be discussed.

Similar to the portion 100a, the portion 600a may also include a conductive pad 102. However, the portion 600a may include three slots (a first slot 602, a second slot 604 and a third slot 606) arranged fully through a thickness of the conductive pad 102. Each of the first, second and third slots 602, 604, 606 may be an elongate slot and may include an electrically insulating material, such as, but not limited to an oxide, a silicon nitride, a silicon oxy-nitride, a silicon carbon nitride, or combinations thereof. In various non-limiting embodiments, each of the slots 602, 604, 606 may be entirely filled with an electrically insulating material. Each slot 602, 604, 606 may extend longitudinally along the second direction 160. As shown in FIGS. 6B and 6C, the passivation layer 106 may be arranged over the first slot 602, the second slot 604 and the third slot 606.

The portion 600a may also include a first plurality of electrical interconnects 108 and a second plurality of electrical interconnects 112 arranged under the conductive pad 102. The first, second and third slots 602, 604, 606 of the portion 600a may be arranged laterally between the exposed portion E102 of the conductive pad 102 and the first plurality of electrical interconnects 108 along the first direction 150. As shown in FIG. 6A, the first slot 602 may be arranged laterally between the second slot 604 and the first plurality of electrical interconnects 108 along the first direction 150; and the second slot 604 may be arranged laterally between the second plurality of electrical interconnects 112 and the first slot 602 along the first direction 150. As shown in FIG. 6A, the first slot 602 may be further arranged laterally between the third slot 606 and the first plurality of electrical interconnects 108 along the first direction 150; and the third slot 606 may be arranged laterally between the second plurality of electrical interconnects 112 and the first slot 602 along the first direction 150. The second plurality of electrical interconnects 112 may be arranged laterally between the exposed portion E102 of the conductive pad 102 and the second slot 604 along the first direction 150, and may be further arranged laterally between the exposed portion E102 of the conductive pad 102 and the third slot 606 along the first direction 150. However, in some alternative non-limiting embodiments, the second plurality of electrical interconnects 112 may instead be arranged under the exposed portion E102 of the conductive pad 102.

Referring to FIG. 6A, the second and third slots 604, 606 may be spaced apart from each other along the second direction 160, such that a portion of the conductive pad 102 may be arranged therebetween. In addition, the second and third slots 604, 606 may be substantially horizontally aligned along the second direction 160. Further, a length L602 of the first slot 602 may be greater than a length L110 of the first electrically conductive element 110. On the other hand, a length L604, L606 of each of the second and third slots 604, 606 may be less than the length L110 of the first electrically conductive element 110. In other words, the lengths L604, L606 of the second and third slots 604, 606 may be less than the length L602 of the first slot 602. The length L604 of the second slot 604 may be approximately equal to the length L606 of the third slot 606.

Figure 7A:
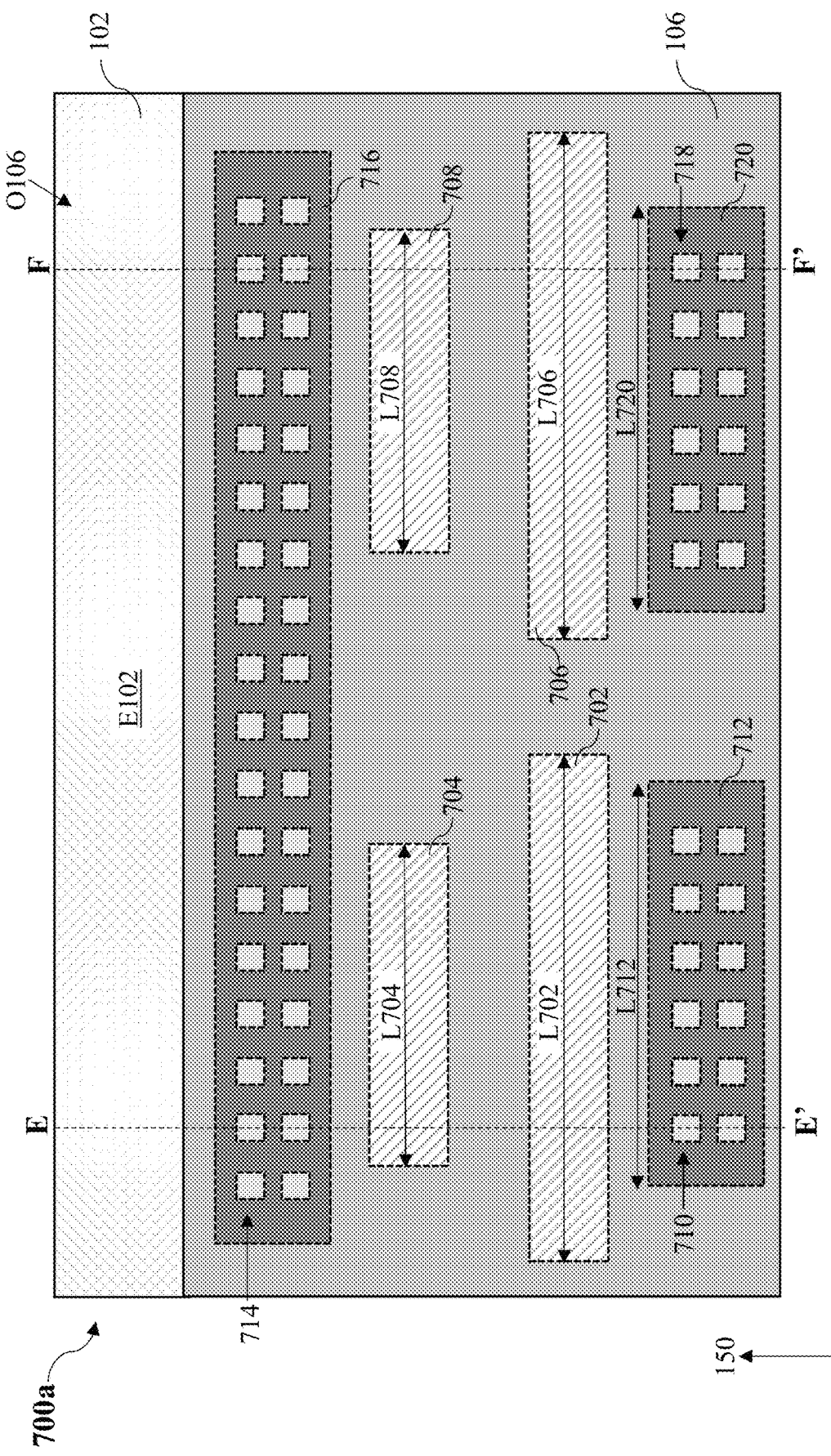
FIG. 7A shows a simplified top view of a portion of a fifth alternative semiconductor structure according to various non-limiting embodiments.
Figure 7B:
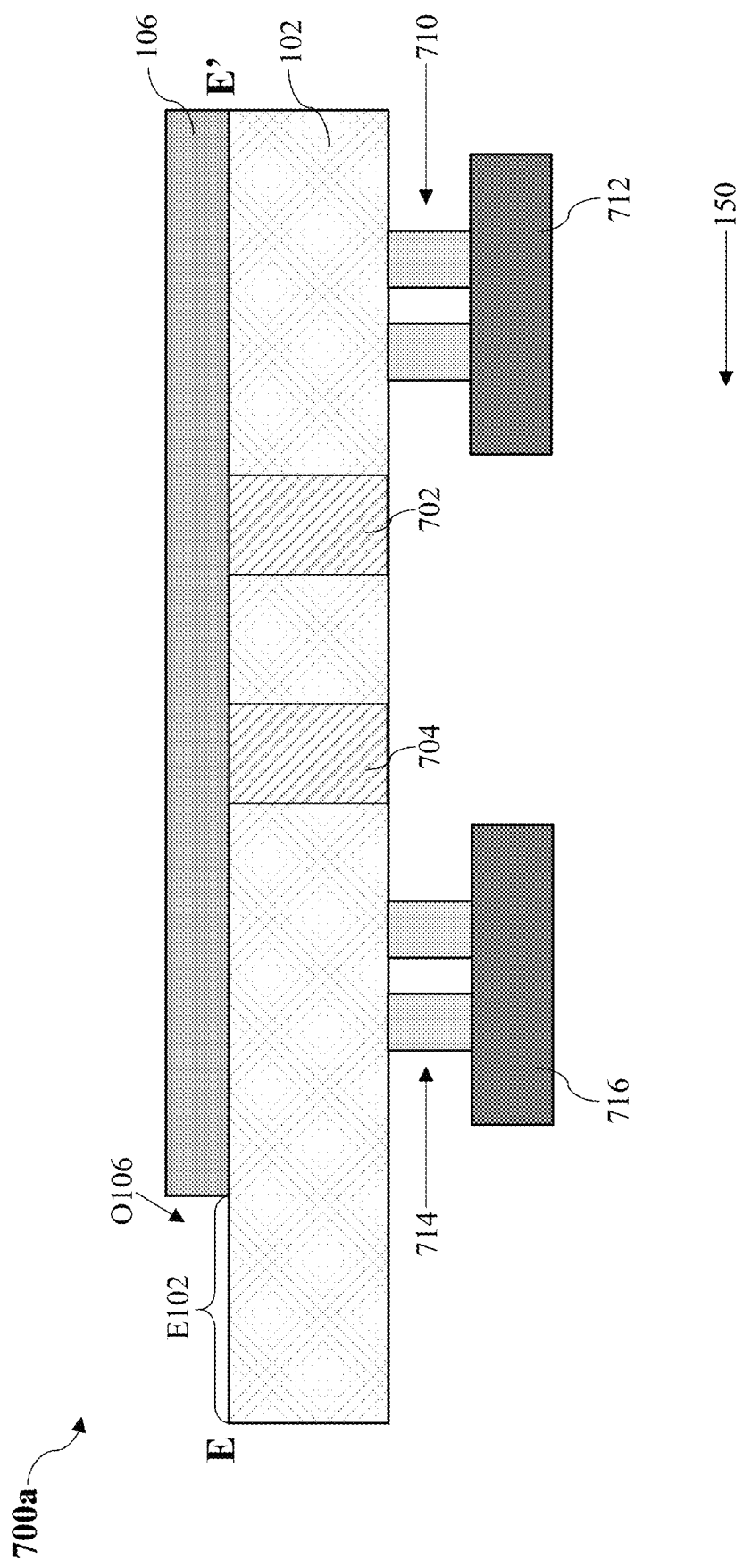
FIG. 7B shows a first simplified cross-sectional view of the portion of FIG. 7A.
Figure 7C:
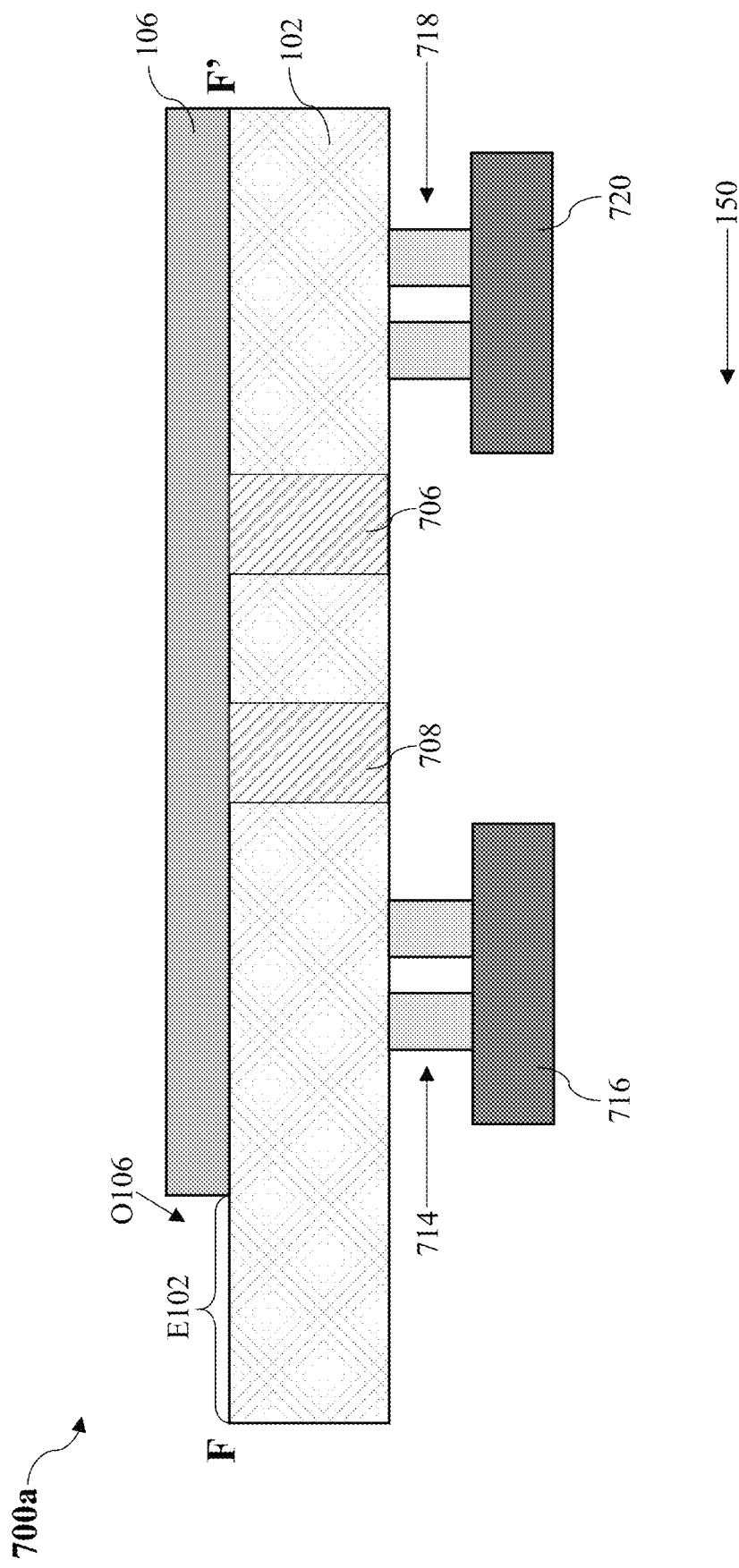
FIG. 7C shows a second simplified cross-sectional view of the portion of FIG. 7A.

FIG. 7A shows a simplified top view of a portion 700a of a fifth alternative semiconductor structure according to various non-limiting embodiments. The fifth alternative semiconductor structure may be similar to the semiconductor structure 100, except that the portion 100a may instead be the portion 700a. FIG. 7B shows a first simplified cross-sectional view of the portion 700a along the line E-E' of FIG. 7A, and FIG. 7C shows a second simplified cross-sectional view of the portion 700a along the line F-F' of FIG. 7A. The portion 700a is similar to the portion 100a shown in FIG. 1B and hence, the common features are labelled with the same reference numerals and need not be discussed.

As shown in FIGS. 7A-7C, the portion 700a may also include a conductive pad 102, but may include four slots (a first slot 702, a second slot 704, a third slot 706 and a fourth slot 708) arranged fully through a thickness of the conductive pad 102. Each of the slots 702, 704, 706, 708 may be an elongate slot and may include an electrically insulating material, such as, but not limited to an oxide, a silicon nitride, a silicon oxy-nitride, a silicon carbon nitride, or combinations thereof. In various non-limiting embodiments, each of the slots 702, 704, 706, 708 may be entirely filled with an electrically insulating material. Each slot 702, 704, 706, 708 may extend longitudinally along the second direction 160. As shown in FIGS. 7B and 7C, the passivation layer 106 may be arranged over all of the first, second, third and fourth slots 702, 704, 706, 708.

As shown in FIG. 7A, the portion 700a may include a first plurality of electrical interconnects 710, a second plurality of electrical interconnects 714, and a third plurality of electrical interconnects 718. In addition, the portion 700a may also include first, second and third electrically conductive elements 712, 716, 720 arranged under the first, second and third plurality of electrical interconnects 710, 714, 718 respectively. The first and second slots 702, 704 may be arranged laterally between the exposed portion E102 of the conductive pad 102 and the first plurality of electrical interconnects 710 along the first direction 150; whereas, the third and fourth slots 706, 708 may be arranged laterally between the exposed portion E102 of the conductive pad 102 and the third plurality of electrical interconnects 718 along the first direction 150. As shown in FIG. 7A, the first slot 702 may be arranged laterally between the second slot 704 and the first plurality of electrical interconnects 710 along the first direction 150; the second slot 704 may be arranged laterally between the second plurality of electrical interconnects 714 and the first slot 702 along the first direction 150; and the second plurality of electrical interconnects 714 may be arranged laterally between the exposed portion E102 of the conductive pad 102 and the second slot 704 along the first direction 150. Similarly, the third slot 706 may be arranged laterally between the fourth slot 708 and the third plurality of electrical interconnects 718 along the first direction 150; the fourth slot 708 may be arranged laterally between the second plurality of electrical interconnects 714 and the third slot 706 along the first direction 150; and the second plurality of electrical interconnects 714 may be further arranged laterally between the exposed portion E102 of the conductive pad 102 and the fourth slot 708 along the first direction 150. Accordingly, the second electrically conductive element 716 arranged under the second plurality of electrical interconnects 714 may extend partially across a length L704 of the second slot 704 and partially across a length L708 of the fourth slot 708. In some alternative non-limiting embodiments, the second plurality of electrical interconnects 714 may be arranged under the exposed portion E102 of the conductive pad 102.

Further, as shown in FIG. 7A, the first slot 702 may be spaced apart from the third slot 706 along the second direction 160, with a portion of the conductive pad 102 arranged therebetween. The first slot 702 may be substantially horizontally aligned with the third slot 706 along the second direction 160. Similarly, the second slot 704 may be spaced apart from the fourth slot 708 along the second direction 160, with a portion of the conductive pad 102 arranged therebetween, and the second slot 704 may be substantially horizontally aligned with the fourth slot 708 along the second direction 160. A length L702 of the first slot 702 may be greater than a length L712 of the first electrically conductive element 712; whereas the length L704 of the second slot 704 may be less than the length L712 of the first electrically conductive element 712. Similarly, a length L706 of the third slot 706 may be greater than a length L720 of the third electrically conductive element 720; whereas a length L708 of the fourth slot 708 may be less than the length L720 of the third electrically conductive element 720. In other words, the lengths L702, L706 of the first and third slots 702, 706 may be greater than the lengths L704, L708 of the second and fourth slots 704, 708. In some non-limiting embodiments, the lengths L702, L706 of the first and third slots 702, 706 may be approximately equal; whereas, the lengths L704, L708 of the second and fourth slots 704, 708 may be approximately equal.

In various non-limiting embodiments, the arrangement of the slots (e.g. slot 104) and the lengths (e.g. length L104) of these slots may be different from those shown in the figures. This is as long as at least a portion of at least one of the slots in the semiconductor structure is arranged between the exposed portion E102 of the conductive pad 102 and each electrical interconnect (e.g. electrical interconnect 108) that is to be electrically connected to the semiconductor die. It is understood that the number of electrical interconnects in the semiconductor structure may also differ from that shown in the figures.

Figure 8:
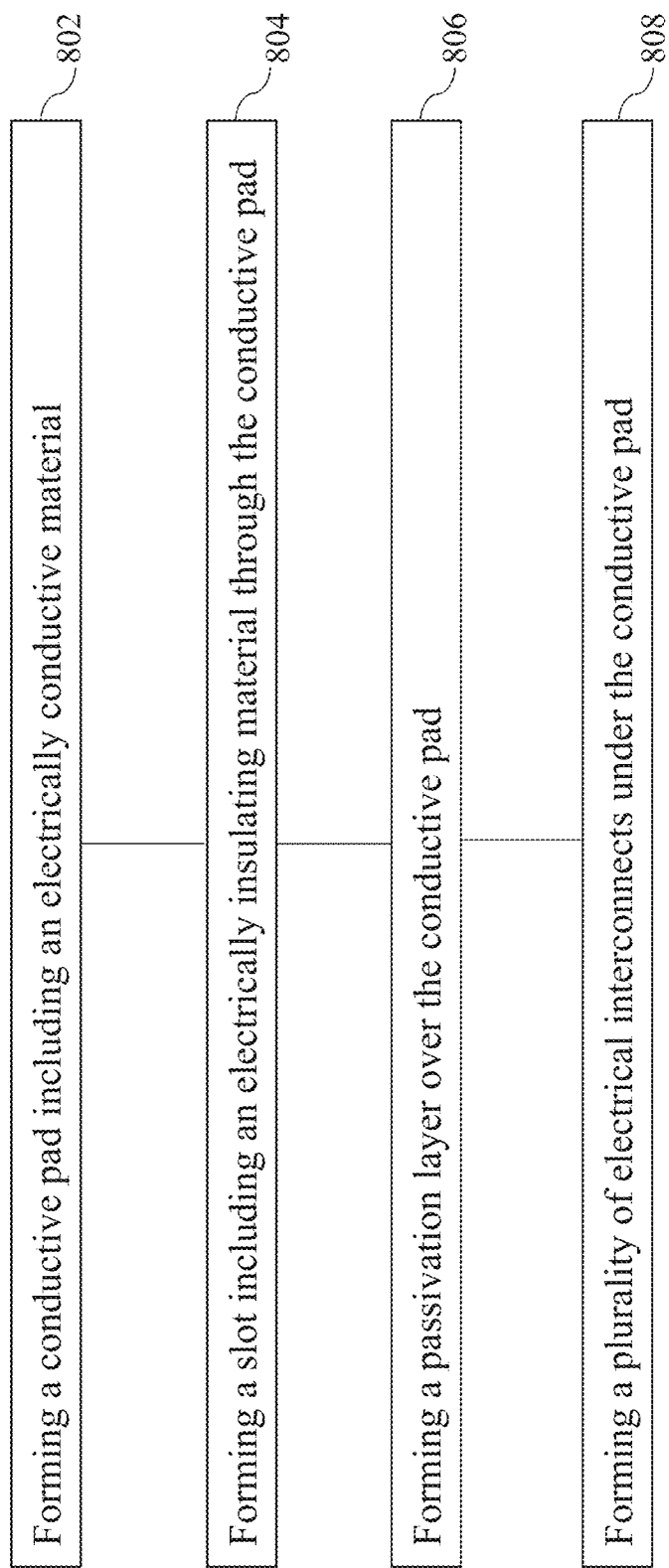
FIG. 8 shows a flow diagram of a method for fabricating a semiconductor structure according to various non-limiting embodiments.

FIG. 8 shows a flow diagram of a method for fabricating a semiconductor structure according to various non-limiting embodiments.

At 802, the method may include forming a conductive pad including an electrically conductive material. The conductive pad may for example, be the conductive pad 102 as described above.

At 804, the method may include forming a slot including an electrically insulating material through the conductive pad. The slot may for example, be the slot 104 as described above. In various non-limiting embodiments, 802 may include providing a pad including an electrically conductive material, and 804 may include forming an opening in the pad by for example, etching a portion of the pad, and depositing an electrically insulating material into the opening to form the slot 104.

At 806, the method may include forming a passivation layer over the conductive pad. The passivation layer may for example, be the passivation layer 106 including an opening O106 (exposing a portion E102 of the conductive pad 102) as described above. In various non-limiting embodiments, 806 may include forming a layer of passivation material over the conductive pad 102 and removing a portion of the passivation material (by for example, etching the passivation material) to form the passivation layer 106 with the opening O106.

At 808, the method may include forming a plurality of electrical interconnects under the conductive pad. The plurality of electrical interconnects may for example, be the first plurality of electrical interconnects 108 described above. 808 may include any process as known to those skilled in the art.

The above described order for the method is only intended to be illustrative, and the method is not limited to the above specifically described order unless otherwise specifically stated. For example, in a non-limiting embodiment, the plurality of electrical interconnects (e.g. electrical interconnects 108) may be formed first. In this non-limiting embodiment, the conductive pad (e.g. conductive pad 102) may then be formed over the electrical interconnects and thereafter, the passivation layer (e.g. passivation layer 106) may be formed over the conductive pad.

In addition, the method may further include forming an electrically conductive element (e.g. electrically conductive element 110) under the plurality of electrical interconnects. The method may also include forming another plurality of electrical interconnects (e.g. electrical interconnects 112) laterally between the exposed portion of the conductive pad (e.g. portion E102 of the conductive pad 102) and the slot (e.g. slot 104), and forming an electrically conductive element (e.g. second electrically conductive element 114) under these electrical interconnects. In various non-limiting embodiments, the method may also include forming further electrical interconnects, further electrically conductive elements and further slots.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A semiconductor structure comprising:
   a conductive pad comprising an electrically conductive material;
   a slot arranged through the conductive pad and comprising an electrically insulating material;
   a passivation layer arranged over the conductive pad and comprising an opening that exposes a portion of the conductive pad; and
   a plurality of electrical interconnects arranged under the conductive pad;
   wherein the slot is arranged laterally between the exposed portion of the conductive pad and the plurality of electrical interconnects,
   wherein the passivation layer covers the slot.

2. The semiconductor structure of claim 1, wherein the slot is arranged laterally between the exposed portion of the conductive pad and the plurality of electrical interconnects along a first direction; and
   wherein the slot comprises an elongate slot extending longitudinally along a second direction substantially perpendicular to the first direction.

3. The semiconductor structure of claim 1, wherein the plurality of electrical interconnects is a first plurality of electrical interconnects;
   wherein the semiconductor structure further comprises a second plurality of electrical interconnects arranged under the conductive pad; and
   wherein the second plurality of electrical interconnects is arranged laterally between the exposed portion of the conductive pad and the slot.

4. The semiconductor structure of claim 3, further comprising an electrically conductive element arranged under the second plurality of electrical interconnects.

5. The semiconductor structure of claim 3, wherein the passivation layer is arranged over the second plurality of electrical interconnects.

6. The semiconductor structure of claim 1, wherein the slot is a first slot;
   wherein the semiconductor structure further comprises a second slot arranged through the conductive pad and comprising an electrically insulating material; and
   wherein the first slot is arranged laterally between the second slot and the plurality of electrical interconnects.

7. The semiconductor structure of claim 6, wherein a length of the second slot is less than a length of the first slot.

8. The semiconductor structure of claim 6, wherein the passivation layer extends continuously over the first slot and the plurality of electrical interconnects, wherein the passivation layer is arranged over the second slot.

9. The semiconductor structure of claim 6, wherein the plurality of electrical interconnects is a first plurality of electrical interconnects;
   wherein the semiconductor structure further comprises a second plurality of electrical interconnects; and
   wherein the second plurality of electrical interconnects is arranged laterally between the exposed portion of the conductive pad and the second slot.

10. The semiconductor structure of claim 6, further comprising a third slot arranged through the conductive pad and comprising an electrically insulating material; and
    wherein the first slot is further arranged laterally between the third slot and the plurality of electrical interconnects.

11. The semiconductor structure of claim 10, wherein the first slot is arranged laterally between the third slot and the plurality of electrical interconnects along a first direction, and wherein the second slot and the third slot are substantially horizontally aligned along a second direction substantially perpendicular to the first direction.

12. The semiconductor structure of claim 10, wherein a length of the second slot is approximately equal to a length of the third slot.

13. The semiconductor structure of claim 10, wherein the plurality of electrical interconnects is a first plurality of electrical interconnects;
    wherein the semiconductor structure further comprises a second plurality of electrical interconnects arranged under the conductive pad; and
    wherein the second plurality of electrical interconnects is arranged laterally between the exposed portion of the conductive pad and the second slot, and is further arranged laterally between the exposed portion of the conductive pad and the third slot.

14. The semiconductor structure of claim 9, wherein the semiconductor structure further comprises a third plurality of electrical interconnects, and a third slot and a fourth slot arranged through the conductive pad and comprising an electrically insulating material;
    wherein the third slot is arranged laterally between the fourth slot and the third plurality of electrical interconnects; and wherein the second plurality of electrical interconnects is arranged laterally between the exposed portion of the conductive pad and the fourth slot.

15. The semiconductor structure of claim 14, wherein the third slot is arranged laterally between the fourth slot and the third plurality of electrical interconnects along a first direction;
   wherein the first slot is substantially horizontally aligned with the third slot along a second direction substantially perpendicular to the first direction; and
   wherein the second slot is substantially horizontally aligned with the fourth slot along the second direction.

16. The semiconductor structure of claim 14, further comprising an electrically conductive element arranged under the second plurality of electrical interconnects, wherein the electrically conductive element extends partially across a length of the second slot and partially across a length of the fourth slot.

17. The semiconductor structure of claim 1, wherein the electrically insulating material comprises an oxide, and wherein the electrically conductive material comprises copper.

18. The semiconductor structure of claim 1, wherein the slot is arranged fully through the conductive pad.

19. The semiconductor structure of claim 1, wherein the slot is arranged directly below the passivation layer and the plurality of electrical interconnects is arranged directly under the conductive pad.

20. A method for fabricating a semiconductor structure, wherein the method comprises:
   forming a conductive pad comprising an electrically conductive material;
   forming a slot comprising an electrically insulating material through the conductive pad;
   forming a passivation layer over the conductive pad, wherein the passivation layer comprises an opening that exposes a portion of the conductive pad; and
   forming a plurality of electrical interconnects under the conductive pad;
   wherein the slot is arranged laterally between the exposed portion of the conductive pad and the plurality of electrical interconnects,
   wherein the passivation layer covers the slot.

* * * * *